Feb. 24, 1953 C. E. INGALLS 2,629,786
AUTOMATIC GAIN CONTROL CIRCUIT
Filed Jan. 9, 1946
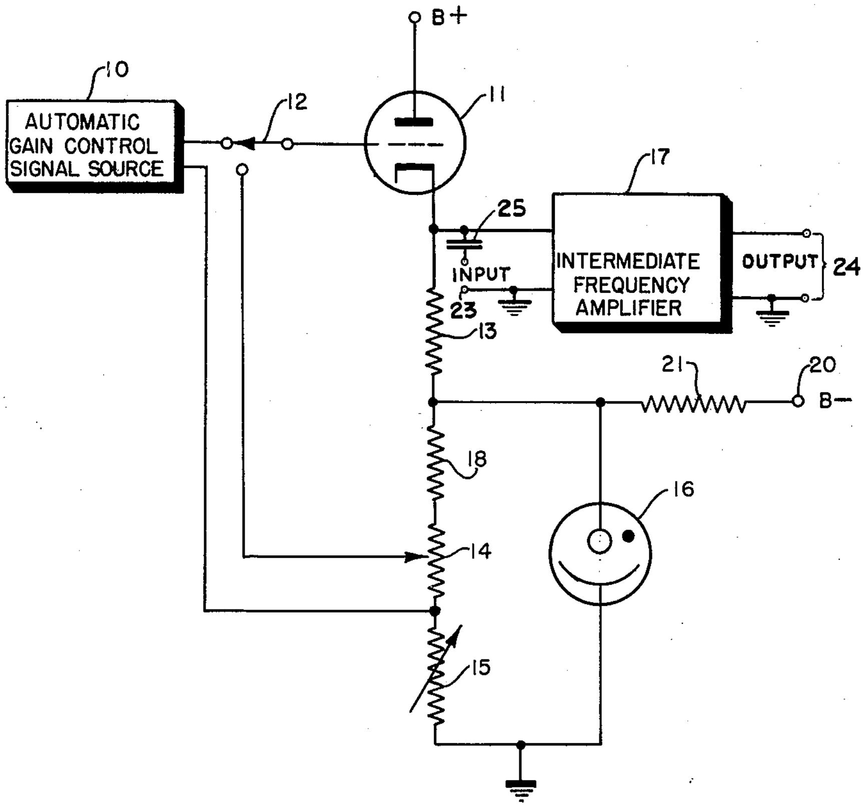
INVENTOR
CLYDE E. INGALLS
BY M. O. Hayes
ATTORNEY Patented Feb. 24, 1953

2,629,786

UNITED STATES PATENT OFFICE 2,629,786

AUTOMATIC GAIN CONTROL CIRCUIT

Clyde E. Ingalls, Canisteo, N. Y., assignor, by mesne assignments, to the United States of America as represented by the Secretary of the Navy Application January 9, 1946, Serial No. 640,111

1 Claim. (Cl. 179—171)

This invention relates in general to gain control systems and more particularly, to an electronic system for feeding gain control voltage to an amplifier through a cathode follower having low output impedance.

This invention is particularly useful in applying the automatic gain control voltage to the grids of intermediate frequency amplifiers in radar receivers where it is essential that the receiver recover quickly after strong overload signals.

Heretofore it has been the practice to introduce bias voltage on the grids of the intermediate frequency amplifiers through an impedance in the grid circuit. Using this system, the receiver was blocked after reception of a strong signal due to the electrical charge on the coupling condenser which is the result of grid current flow. The discharge of this coupling condenser through the bias injecting impedance is an exponential function whose time constant is equal to the product of the capacitance and the resistance in series with it. Thus, this prior system is objectionable since the coupling capacitor charges through a short time constant circuit (the grid to cathode resistance of the tube) and discharges through a long time constant circuit which kept the receiver inoperative for relatively long periods of time.

Another prior system for controlling the gain of radar receivers has ulitized variation of the screen voltage or of the screen and plate voltages of the intermediate frequency amplifiers. This method of control has been objectionable for at least two reasons. First, the control voltage had to be amplified appreciably and had to be capable of delivering relatively large amounts of current. Such amplifiers are bulky as well as expensive. Second, during the reception of a strong signal the screen voltage was lowered, reducing the space current of the amplifier tube which reduced the amplifier bias developed by space current flow through a cathode resistor. When the incoming peak signal exceeded the bias, the amplifier tube would draw grid current and the incoming signal would be distorted. Thus, distortion would result because of the amplifier bias decrease at a time when it should have been increased.

An object of this invention is to provide a method of gain control whereby a radar or other receiver will not be blocked by the reception of strong signals.

Another object of this invention is to provide an apparatus for delivering automatic gain control voltage to an amplifier through a low impedance source.

A still further object of this invention is to provide an apparatus for applying automatic or manual gain control voltage to an amplifier through a low impedance source.

Further objects of this invention as well as its arrangement and operation, will be apparent from the following description and claim in connection with the accompanying drawing, which is a schematic diagram of an embodiment of the invention.

Referring to the drawing, the automatic gain control signal source 10 is connected to the grid of the electron tube 11, which is connected as a conventional cathode follower, through the single pole double throw switch 12. The resistor 13 forms the load resistance of the cathode follower.

Block 17 represents an intermediate frequency amplifier stage having input terminals 23 and output terminals 24. The amplifier includes a vacuum tube, the control grid of which is coupled to a previous stage through capacitor 25. The output terminals may be connected to a further intermediate frequency amplifier in a conventional manner. The cathode of tube 11 is directly connected to the grid circuit of amplifier 17, and tube 11 having low output impedance, thereby provides a low impedance coupling between gain control signal source 10 and the grid circuit of amplifier 17. A voltage regulator tube 16 is provided and is connected from the load resistor 13 to ground to maintain proper bias on the cathode follower. This bias is obtained from an unregulated negative power source at terminal 20 through dropping resistor 21. The voltage dividing network consisting of resistor 18, manual gain control potentiometer 14 and minimum bias control variable resistor 15 is connected in parallel with regulator tube 16.

In normal operation, with no signal coming in, the variable resistor 15 is adjusted so that the grid bias on vacuum tube 11 creates the desired bias voltage on the grid circuit of the intermediate amplifier 17. The automatic gain control voltage from source 10 will become more negative when a strong signal is received. This negative voltage is transmitted through the cathode follower 11 at the cathode thereof and applied to the grid circuit 17 of the intermediate frequency amplifier thereby increasing its bias. Since the output impedance of a cathode follower in most instances is less than 500 ohms, the time constant of the discharge circuit of the intermediate amplifier grid circuit coupling condenser 25 has been made comparable to the charge time constant which is approximately one micro-second.

If the arm of switch 12 is changed to its other position, the potentiometer 14 becomes the manual gain control. In operation, this circuit does not reduce the gain of the receiver due to grid current in the intermediate frequency amplifier at the time of reception of a strong signal, but due to the low impedance cathode follower circuit, the receiver will not remain blocked for more than a few micro-seconds.

The invention described in the foregoing specification need not be limited to the details shown, which are considered to be illustrative of one form the invention may take.

I claim:

In combination, an amplifier having an input grid circuit and output terminals, an automatic gain control circuit for producing a unidirectional gain control signal, a cathode follower circuit including an electron tube having at least an anode, cathode and cathode grid and an unbypassed low resistance cathode resistor, a grounded point providing a reference potential level, a first potential source having its positive and negative terminals directly connected to said anode and said grounded point, respectively, a second potential source having its negative terminal connected to the end of said cathode resistor remote from said cathode and its positive terminal connected to said grounded point whereby said electron tube and said cathode resistor are serially connected between points positive and negative with respect to ground, means for applying said unidirectional gain control signal between the grid of said electron tube and a second point of fixed potential less negative with respect to ground than the negative terminal of said second potential source, and low impedance conductor means directly connecting the input grid circuit of said amplifier between said cathode and ground, the potential level of said second point being arranged whereby said cathode is biased negatively with respect to said grounded point with no unidirectional signal present on said control grid and whereby said unidirectional signal when present on said control grid is applied to said amplifier input circuit substantially without change of wave form and at low impedance and time constant.

CLYDE E. INGALLS.

REFERENCES CITED

The following references are of record in the file of this patent:

UNITED STATES PATENTS

| Number | Name | Date |
|---|---|---|
| 1,720,352 | Schmierer | July 9, 1929 |
| 2,240,600 | Applegarth, Jr. | May 6, 1941 |
| 2,312,306 | Bierwirth | Mar. 2, 1943 |
| 2,480,842 | Farnsworth | Sept. 6, 1949 |

OTHER REFERENCES

Mallory, Yaxley Radio Service Encyclopedia, pp. 117–121, published January 1937. (Copy in Div. 69.)